(12) United States Patent
Hayakawa et al.

(10) Patent No.: US 11,658,464 B2
(45) Date of Patent: May 23, 2023

(54) SEMICONDUCTOR OPTICAL AMPLIFIER

(71) Applicant: FUJIFILM Business Innovation Corp., Tokyo (JP)

(72) Inventors: Junichiro Hayakawa, Kanagawa (JP); Daiki Tominaga, Kanagawa (JP); Akemi Murakami, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 872 days.

(21) Appl. No.: 16/535,031

(22) Filed: Aug. 7, 2019

(65) Prior Publication Data

US 2020/0059070 A1 Feb. 20, 2020

(30) Foreign Application Priority Data

Aug. 14, 2018 (JP) .............................. JP2018-152745

(51) Int. Cl.
*H01S 5/10* (2021.01)
*H01S 5/183* (2006.01)
(Continued)

(52) U.S. Cl.
CPC .......... *H01S 5/18311* (2013.01); *H01S 5/026* (2013.01); *H01S 5/1003* (2013.01);
(Continued)

(58) Field of Classification Search
CPC .... H01S 5/18311; H01S 5/026; H01S 5/1003; H01S 5/18344; H01S 5/50
See application file for complete search history.

(56) References Cited

U.S. PATENT DOCUMENTS 5,228,049 A * 7/1993 Paoli .................... H01S 5/04254
372/50.22
5,793,521 A * 8/1998 O'Brien .................. H01S 5/026
359/344
(Continued)

FOREIGN PATENT DOCUMENTS

JP 2018032793 3/2018

OTHER PUBLICATIONS

M. Nakahama et al. ("Slow light VCSEL Amplifier for High-resolution Beam Steering and High-power Operations", IEEE, CLEO 2016 (Year: 2016).*
(Continued)

*Primary Examiner* — Yuanda Zhang
(74) *Attorney, Agent, or Firm* — JCIPRNET (57) ABSTRACT

A semiconductor optical amplifier includes a conductive region that is provided on a substrate and allows light transmission, and a nonconductive region that is provided around the conductive region and prohibits light transmission. The conductive region includes a first region including a light-coupling portion to which light from an external light-source unit is coupled, and a second region having a narrower width than the first region and connected to the first region through a connecting portion, the second region including a light-amplifying portion amplifying the light from the light-coupling portion by propagating the light in a predetermined propagating direction along a surface of the substrate, the light-amplifying portion outputting the amplified light in a direction intersecting the surface of the substrate. Seen in a direction perpendicular to the surface of the substrate, the semiconductor optical amplifier includes a portion where a width of the conductive region is continuously reduced from the first region to the second region.

16 Claims, 4 Drawing Sheets

(51) Int. Cl.
  *H01S 5/026* (2006.01)
  *H01S 5/343* (2006.01)
  *H01S 5/50* (2006.01)
  *H01S 5/125* (2006.01)

(52) U.S. Cl.
  CPC .......... *H01S 5/125* (2013.01); *H01S 5/18344* (2013.01); *H01S 5/34353* (2013.01); *H01S 5/50* (2013.01)

(56) References Cited

U.S. PATENT DOCUMENTS 6,310,995 B1 * 10/2001 Saini .................... G02B 6/1228
                                                          385/39
10,095,152 B2    10/2018 Kondo et al.

OTHER PUBLICATIONS

Zeuku Ho et al., "Consideration of coupling efficiency of surface emitting laser amplifier-Investigation of Coupling Efficiency of VCSEL Amplifier" with English translation thereof, The 78th JSAP Autumn Meeting, Aug. 2017, pp. 1-4.

"Office Action of Japan Counterpart Application" with English translation thereof, dated May 10, 2022, p. 1-p. 5.

* cited by examiner

SEMICONDUCTOR OPTICAL AMPLIFIER

CROSS-REFERENCE TO RELATED APPLICATIONS

This application is based on and claims priority under 35 USC 119 from Japanese Patent Application No. 2018-152745 filed Aug. 14, 2018.

BACKGROUND

(i) Technical Field

The present disclosure relates to semiconductor optical amplifiers and particularly to a semiconductor optical amplifier including a distributed-Bragg-reflector waveguide.

(ii) Related Art

Regarding a semiconductor optical amplifier including a distributed-Bragg-reflector waveguide, a light-emitting-device array is disclosed by Japanese Unexamined Patent Application Publication No. 2018-032793. The light-emitting-device array includes a plurality of semiconductor layered structures. The semiconductor layered structures each include a light-emitting portion provided on a substrate, and a light-amplifying portion stretching from the light-emitting portion along a surface of the substrate and being longer than the light-emitting portion in the stretching direction thereof. The light-amplifying portion amplifies light emitted from the light-emitting portion and propagated in the light-amplifying portion in the stretching direction, and outputs the amplified light from a light-outputting portion extending in the stretching direction. The plurality of semiconductor layered structures are arranged such that the respective light-amplifying portions stretch substantially parallel to one another.

SUMMARY

Aspects of non-limiting embodiments of the present disclosure relate to a semiconductor optical amplifier including a light-coupling portion and a light-amplifying portion each having a conductive region and a nonconductive region provided around the conductive region, in which optical coupling efficiency is higher than in a configuration not including a portion where the width of the conductive region in a connecting portion between the light-coupling portion and the light-amplifying portion is continuously reduced from the light-coupling portion to the light-amplifying portion.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a semiconductor optical amplifier including a conductive region that is provided on a substrate and allows light transmission, and a nonconductive region that is provided around the conductive region and prohibits light transmission. The conductive region includes a first region including a light-coupling portion to which light from an external light-source unit is coupled, and a second region having a narrower width than the first region and connected to the first region through a connecting portion, the second region including a light-amplifying portion amplifying the light from the light-coupling portion by propagating the light in a predetermined propagating direction along a surface of the substrate, the light-amplifying portion outputting the amplified light in a direction intersecting the surface of the substrate. Seen in a direction perpendicular to the surface of the substrate, the semiconductor optical amplifier includes a portion where a width of the conductive region is continuously reduced from the first region to the second region.

BRIEF DESCRIPTION OF THE DRAWINGS

Exemplary embodiments of the present disclosure will be described in detail based on the following figures wherein.

DETAILED DESCRIPTION

First Exemplary Embodiment

Figure 1A:
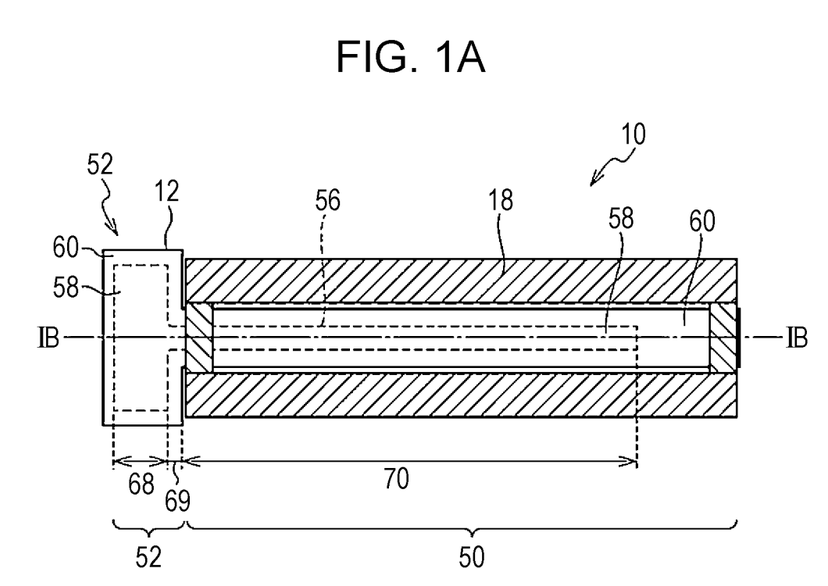
FIGS. 1A and 1B illustrate an exemplary configuration of a semiconductor optical amplifier according to a first exemplary embodiment in plan view and in sectional view, respectively.
Figure 1B:
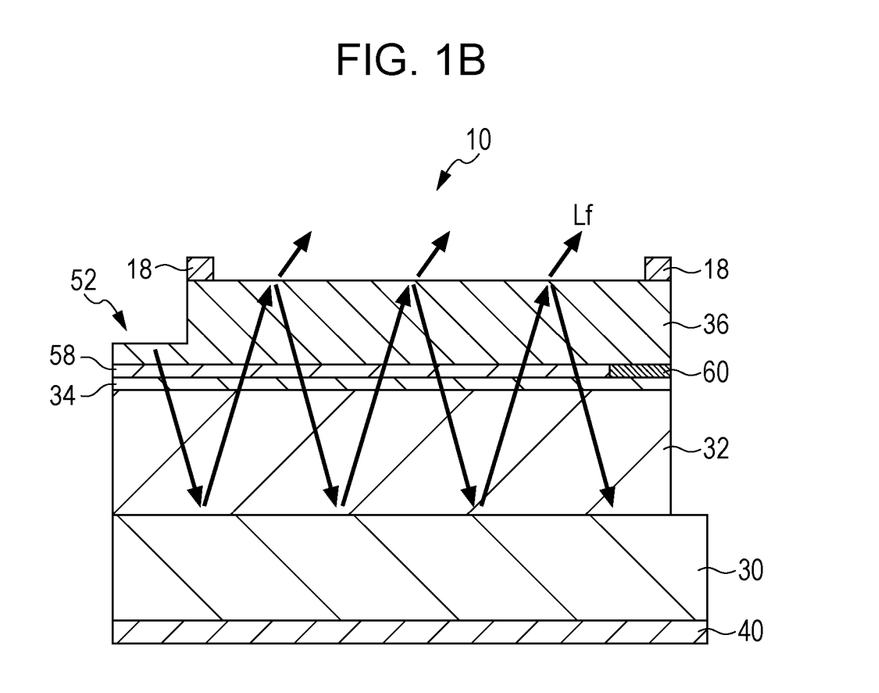

A semiconductor optical amplifier 10 according to a first exemplary embodiment will now be described with reference to FIGS. 1A, 1B, 2A, and 2B. FIG. 1A is a plan view of the semiconductor optical amplifier 10. FIG. 1B is a sectional view taken along line IB-IB illustrated in FIG. 1A. As illustrated in FIGS. 1A and 1B, the semiconductor optical amplifier (SOA) 10 includes a light-amplifying portion 50 and a light-coupling portion 52. The light-amplifying portion 50 and the light-coupling portion 52 are integrally formed as a semiconductor layered structure. The semiconductor layered structure forms a mesa post 12.

The light-amplifying portion 50 has a function of amplifying light (seed light) coupled to the light-coupling portion 52 and outputting the amplified light. The light-amplifying portion 50 according to the first exemplary embodiment is, for example, a surface-emitting light-amplifying portion including a GaAs-based distributed-Bragg-Reflector waveguide (hereinafter abbreviated to "DBR waveguide"). Specifically, as illustrated in FIG. 1B, the light-amplifying portion 50 includes an n-electrode 40 provided on the back surface of a substrate 30; and a lower DBR 32, an active region 34, an upper DBR 36, a nonconductive region 60, a conductive region 58, and a p-electrode 18 stacked on the front surface of the substrate 30.

In the first exemplary embodiment, the substrate 30 is an n-GaAs substrate, and the n-electrode 40 is provided on the back surface of the substrate 30. According to the first exemplary embodiment, the lower DBR 32 is of n-type, and the upper DBR 36 is of p-type. To activate the semiconductor optical amplifier 10, the positive pole of a power source is connected to the p-electrode 18, and the negative pole of the power source is connected to the n-electrode 40, whereby a driving current is made to flow from the p-electrode 18 to the n-electrode 40. The polarity of the substrate 30, the lower DBR 32, and the upper DBR 36 is not limited to the above and may be reversed. That is, the substrate 30 may be a p-GaAs substrate, the lower DBR 32 may be of p-type, and the upper DBR 36 may be of n-type.

The lower DBR 32 is paired with the upper DBR 36, to be described below, to form a resonator that contributes to light emission from the semiconductor optical amplifier 10. The lower DBR 32 is a multilayer reflector in which two kinds of semiconductor layers having the same thickness of $0.25\lambda/n$ but different refractive indices are alternately stacked. Here, $\lambda$ denotes the oscillation wavelength of the semiconductor optical amplifier 10, and n denotes the refractive index of a medium (the semiconductor layers). For example, the lower DBR 32 includes n-$Al_{0.90}Ga_{0.1}As$ layers having a low refractive index and n-$Al_{0.2}Ga_{0.8}As$ layers having a high refractive index that are alternately stacked.

The active region 34 according to the first exemplary embodiment may include, for example, a lower spacer layer, a quantum-well active region, and an upper spacer layer (not illustrated). The quantum-well active region according to the first exemplary embodiment may include, for example, a barrier layer formed of four $Al_{0.3}Ga_{0.7}As$ layers, and three GaAs quantum-well layers each provided between adjacent ones of the barrier layers. The lower spacer layer and the upper spacer layer provided between the quantum-well active region and the lower DBR 32 and between the quantum-well active region and the upper DBR 36, respectively, have a function of adjusting the length of the resonator and serve as cladding layers for confining carriers.

The nonconductive region 60 and the conductive region 58 provided on the active region 34 are each a p-oxide confinement layer, i.e. a current confinement layer. More specifically, the nonconductive region 60 corresponds to an oxide region, and the conductive region 58 corresponds to a non-oxide region. In the first exemplary embodiment, part of one of the layers forming the upper DBR 36 is oxidized to form the nonconductive region 60 (the oxide region), and the remaining region, excluding the nonconductive region 60, of that layer forms the conductive region 58 (the non-oxide region) that is not oxidized. In a process of manufacturing the semiconductor optical amplifier 10, the nonconductive region 60 is formed by oxidizing peripheral part of a mesa structure obtained as a half-finished semiconductor optical amplifier including at least layers below the upper DBR 36. The interface between the conductive region 58 and the nonconductive region 60 forms an oxide front 56. The path for the current flowing from the p-electrode 18 to the n-electrode 40 is narrowed by the conductive region 58. While the first exemplary embodiment concerns a case where the nonconductive region 60 (the oxide region) is formed in one of the layers forming the upper DBR 36, the present disclosure is not limited to such an embodiment. The nonconductive region may be formed in a plurality of layers included in the upper DBR 36, or in the lower DBR 32.

The upper DBR 36 is a multilayer reflector in which two kinds of semiconductor layers having the same thickness of $0.25\lambda/n$ but different refractive indices are alternately stacked. For example, the upper DBR 36 includes p-$Al_{0.90}Ga_{0.1}As$ layers having a low refractive index and p-$Al_{0.2}Ga_{0.8}As$ layers having a high refractive index that are alternately stacked. The upper DBR 36 may be covered with an emitting-surface-protecting layer (not illustrated) that protects an emitting surface.

The light-coupling portion 52 according to the first exemplary embodiment is a site to which a light source that generates light (seed light) to be inputted to the semiconductor optical amplifier 10 is coupled. In the first exemplary embodiment, light generated by an external light source (not illustrated) is propagated in an optical fiber, and an output end of the optical fiber is coupled to the light-coupling portion 52 serving as a light-source portion of the semiconductor optical amplifier 10, whereby the light inputted to the semiconductor optical amplifier 10 is guided into the DBR waveguide. The external light source may be, for example, a vertical-cavity surface-emitting laser (VCSEL).

As with the light-amplifying portion 50, the light-coupling portion 52 also includes a nonconductive region 60 and a conductive region 58. As illustrated in FIG. 1A, the conductive region 58 of the light-coupling portion 52 is formed by widening the conductive region 58 of the light-amplifying portion 50. The nonconductive region 60 of the light-coupling portion 52 is also formed by widening the nonconductive region 60 of the light-amplifying portion 50 correspondingly to the widening of the conductive region 58. That is, the conductive region 58 of the light-amplifying portion 50 and the conductive region 58 of the light-coupling portion 52 form a single element, and the nonconductive region 60 of the light-amplifying portion 50 and the nonconductive region 60 of the light-coupling portion 52 form a single element. Hereinafter, the conductive region in the light-coupling portion 52 is also referred to as a "first region 68", and the conductive region in the light-amplifying portion 50 is also referred to as a "second region 70". The first region 68 and the second region 70 are connected to each other with a "connecting region 69". Details of the connecting region 69 will be described separately below.

As described above, a semiconductor optical amplifier employing a DBR waveguide includes a pair of DBRs provided on a semiconductor substrate, and an active region and resonator spacer layers that are provided between the pair of DBRs. The region between the DBRs serves as an optical waveguide. Light inputted to the DBR waveguide is propagated as slow light while undergoing multiple reflection in a substantially vertical direction. In this process, when a current is supplied into the active region through the p-electrode and the n-electrode that are provided on two respective side of the DBR, the inputted light is amplified, and the amplified beam is outputted in a direction intersecting the surface of the substrate and tilted forward (in an obliquely forward direction) with respect to a propagating direction in which the light is propagated in the DBR waveguide. The beam outputted in the obliquely forward direction is occasionally referred to as forward output (Lf).

More specifically, a region of the semiconductor optical amplifier that is between the p-electrode and the n-electrode has a function as an optical waveguide and a function as a light-amplifying portion, and amplified light is emitted in a direction intersecting the surface of the substrate. In other words, a semiconductor optical amplifier employing a DBR waveguide is a surface-emitting semiconductor optical amplifier. In such a configuration, light is inputted to the light-amplifying portion as follows. A portion to which light is inputted (the light-coupling portion 52) is formed by etching off part of the DBR to reduce reflectance, and external light is made to be obliquely incident thereon, whereby light permeates through to the light-amplifying portion and is propagated therein.

In such a configuration, optical coupling efficiency at the introduction of light from the external light source is to be considered. Improvement in optical coupling efficiency has been considered in the related art. It is known that optical coupling efficiency of the light-coupling portion depends on parameters such as the wavelength of the light from the external light source, the angle of incidence of the light from the external light source, the number of pairs of DBRs to be provided, and so forth. However, such parameters are substantially determined by characteristics other than optical coupling efficiency and are not adjustable only for the improvement in optical coupling efficiency. Therefore, a new technique for improving the optical coupling efficiency of the light-coupling portion has been sought. The light-coupling portion 52 of the semiconductor optical amplifier 10 according to the first exemplary embodiment addresses such circumstances.

Figure 2A:
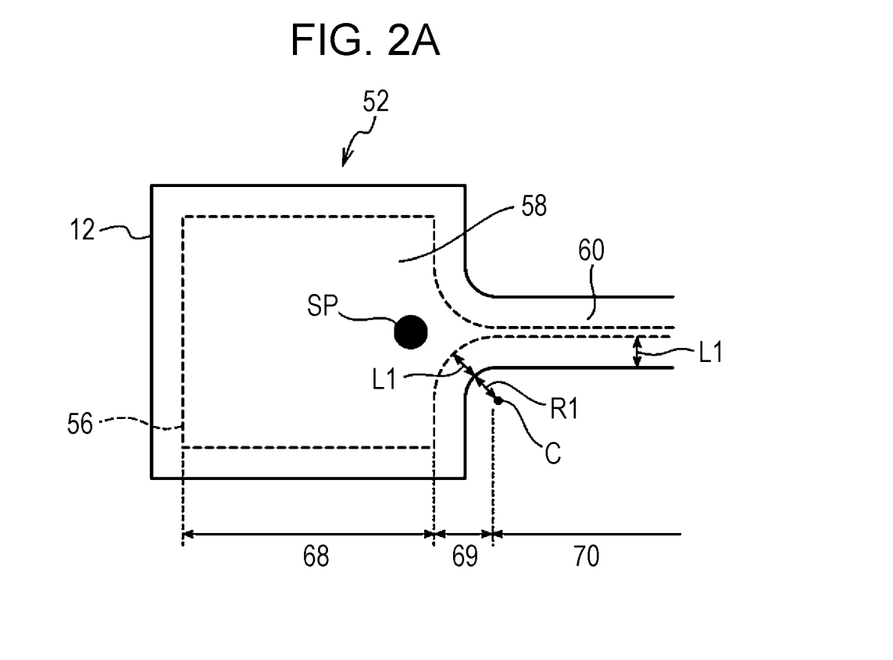
FIG. 2A is a plan view illustrating an exemplary configuration of a light-coupling portion included in the semiconductor optical amplifier according to the first exemplary embodiment.
Figure 2B:
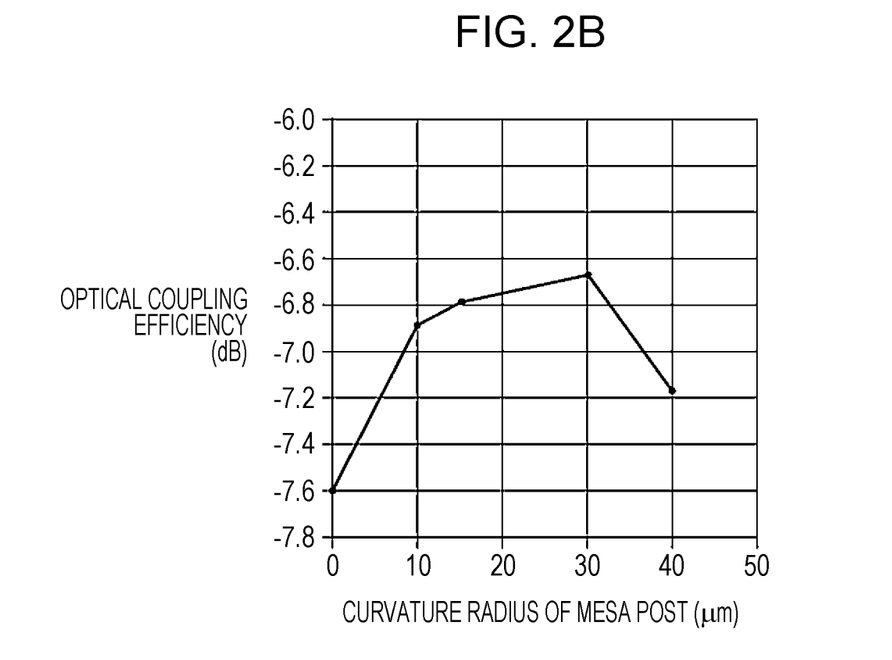
FIG. 2B is a graph illustrating the relationship between the curvature radius of a mesa post and optical coupling efficiency.

Referring now to FIGS. 2A and 2B, the light-coupling portion 52 according to the first exemplary embodiment will be described in detail. As illustrated in FIG. 2A, the light-coupling portion 52 includes the first region 68, and the connecting region 69 provided between the first region 68 and the second region 70. The first region 68, the connecting region 69, and the second region 70 form respective portions of the conductive region 58.

As illustrated in FIG. 2A, the semiconductor optical amplifier 10 according to the first exemplary embodiment includes, in the connecting region 69, a portion where the width of the conductive region 58 is continuously reduced (continuously changes) from the first region 68 to the second region 70 such that arc-shaped (curved) outline segments are formed between the first region 68 and the second region 70. The mesa post 12 also includes arc-shaped outline segments conforming to the respective arc-shaped outline segments of the conductive region 58 in the connecting region 69, because the conductive region 58 according to the first exemplary embodiment is obtained as a result of forming the nonconductive region 60 by oxidizing the mesa post 12 with steam as described above. Letting the curvature radius of each of the arc-shaped outline segments of the mesa post 12 in the connecting region 69 be denoted as R1 with the center of curvature being at a point C, and the length of oxidation (the depth by which the mesa post 12 is oxidized) be denoted as L1, the curvature radius of the conductive region 58 with respect to the point C (i.e. the curvature radius of the oxide front 56) is expressed as (R1+L1).

Here, coupling of light from the external light source (not illustrated) to the light-coupling portion 52 will be discussed. As described above, in the first exemplary embodiment, light from the external light source is introduced into the light-coupling portion 52 through, for example, an optical fiber (not illustrated). A spot SP illustrated in FIG. 2A represents a spot formed by the external light traveling through the optical fiber. As illustrated in FIG. 2A, in the first exemplary embodiment, the spot SP is formed near the connecting region 69. More specifically, the spot SP may be formed such that at least part thereof is positioned in the portion where the width of the conductive region 58 is continuously reduced. The optical axis of the spot SP is tilted such that the light travels obliquely through the DBR waveguide as illustrated in FIG. 1B. The position of the spot SP illustrated in FIG. 2A is only exemplary and may be any position in the first region 68.

In the first exemplary embodiment, light is propagated in a single mode in the light-amplifying portion 50. To propagate light in a single mode, the conductive region 58 forming the waveguide in the light-amplifying portion 50 needs to have a width of about 2 to 3 µm in plan view (when seen in a direction perpendicular to the substrate 30). In sectional view (when seen in a direction parallel to the substrate 30), as illustrated in FIG. 1B, light is propagated by being reflected between the lower DBR 32 and the upper DBR 36. Therefore, the light is propagated within a range of about 10 µm. The size of the light-coupling portion 52 according to the first exemplary embodiment is, for example, about 100 µm×100 µm at the outline of the mesa post 12.

The seed light inputted from the external light source through the optical fiber is also single-mode light and forms the spot SP having a diameter of several microns. That is, the diameter of the spot SP is greater than the width of the conductive region 58, forming the optical waveguide, in the light-amplifying portion 50. Therefore, the light-coupling portion 52 according to the first exemplary embodiment is wider than the light-amplifying portion 50. In the first exemplary embodiment under such conditions, the connecting region 69 in which the width of the conductive region 58 is continuously reduced is provided between the first region 68 and the second region 70. The presence of the connecting region 69 improves the optical coupling efficiency between the external light source and the light-coupling portion 52 according to the first exemplary embodiment.

Figure 5:
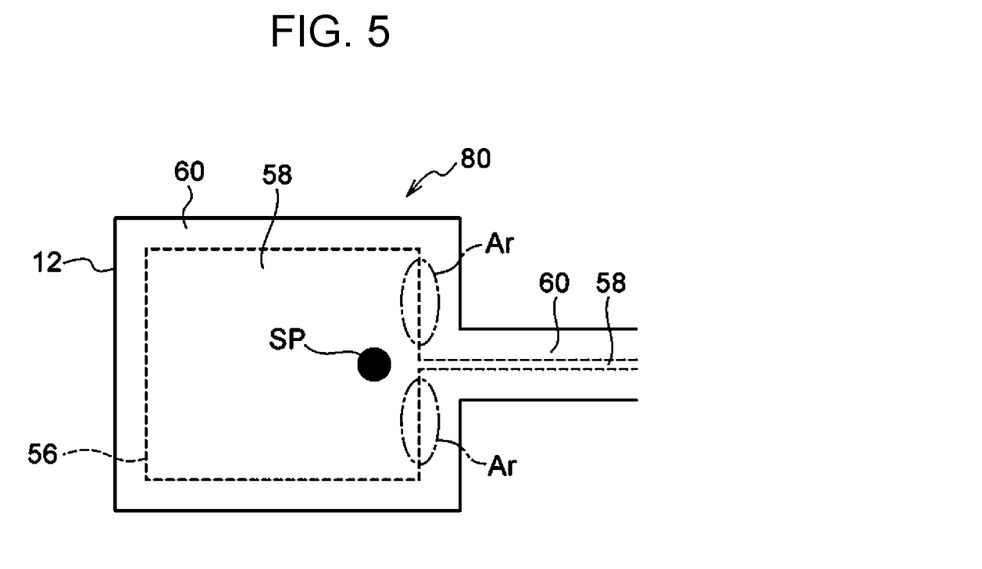
FIG. 5 is a plan view illustrating an exemplary configuration of a light-coupling portion included in a semiconductor optical amplifier according to a comparative embodiment.

Now, functions of the connecting region 69 according to the first exemplary embodiment will be discussed. FIG. 5 illustrates a light-coupling portion 80, including no connecting region 69, of a semiconductor optical amplifier according to a comparative embodiment, with a spot SP formed thereon. In the light-coupling portion 80, since the conductive region 58 is wider than the diameter of the spot SP, external light forming the spot SP is basically expected to be received efficiently. However, the conductive region 58 in the light-coupling portion 80 is intentionally provided with no portion where the width thereof is continuously reduced (that is, the width of the mesa post 12 changes stepwise from the light-coupling portion 52 to the light-amplifying portion 50, or the curvature radius R1 illustrated in FIG. 2A is 0). Therefore, the proportion of outline segments Ar extending perpendicularly to the direction in which the light forming the spot SP is propagated is greater than in the first exemplary embodiment. Accordingly, the proportion of light reflected by the outline segments Ar in the light forming the spot SP and propagated toward the light-amplifying portion 50 is greater than in the first exemplary embodiment. The light reflected by the outline segments Ar is repeatedly reflected by the oxide front 56 in the light-coupling portion 52 and may highly probably result in an optical loss. Therefore, expected improvement in the optical coupling efficiency of the light-coupling portion 80 is limited. The reason why the light is reflected by the oxide front 56 is that, in general, the conductive region 58 has a higher refractive index than the nonconductive region 60.

In contrast, the light-coupling portion 52 according to the first exemplary embodiment illustrated in FIG. 2A includes, in the connecting region 69, the portion where the width of the conductive region 58 is continuously reduced, i.e. the arc-shaped outline segments. With the arc-shaped outline segments, the light forming the spot SP is more likely to be guided toward the conductive region 58 in the light-amplifying portion 50. In other words, the light-coupling portion 52 is configured such that the proportion of outline segments similar to the outline segments Ar of the light-coupling portion 80 is small. Therefore, reflection at the boundary between the first region 68 and the second region 70 is suppressed. Thus, the optical coupling efficiency of the light-coupling portion 52 is improved. In some cases, despite that the outline of the mesa post 12 forming the light-coupling portion 80 changes stepwise, the conductive region 58 may have arc-shaped outline segments in a connecting portion between the light-coupling portion 80 and the light-amplifying portion 50, depending on the direction in which oxidation progresses or the like. In such a case, a slight improvement in the optical coupling efficiency is expected. Therefore, depending on the level of optical coupling efficiency to be targeted, the light-coupling portion 80 may be employed.

FIG. 2B is a graph illustrating results of an experiment regarding changes in optical coupling efficiency with respect to the curvature radius (R1 in FIG. 2A) of the arc-shaped outline segments of the mesa post 12. The optical coupling efficiency graphed in FIG. 2B is calculated from a current value obtained by applying a reverse bias to the light-amplifying portion 50 and photoelectrically converting the light propagated from the light-coupling portion 52. As graphed in FIG. 2B, optical coupling efficiency is improved particularly in a specific range of curvature radius R1 of the mesa post 12. According to the experiment, if the optical coupling efficiency is −7.2 dB or higher, the light-coupling portion 52 and the external light source are coupled to each other with no problem. Hence, according to the graph in FIG. 2B, an optical coupling efficiency that practically has no problem is obtained if the curvature radius R1 of the mesa post 12 is 5 μm or greater and 40 μm or smaller, which corresponds to a curvature radius of the conductive region 58 (R1+L1) of 20 μm or greater and 55 μm or smaller, because L1 is 15 μm in the first exemplary embodiment.

The reason why optical coupling efficiency is improved in a specific range of curvature radius R1 of the mesa post 12 as graphed in FIG. 2B is as follows. If the curvature radius R1 is too small, a configuration closely resembling the light-coupling portion 80 illustrated in FIG. 5 is obtained, resulting in a reduction in optical coupling efficiency. If the curvature radius R1 is too large, the proportion of the arc-shaped outline segments in the connecting region 69 becomes too large, resulting in an increase in the proportion of light traveling toward the inner side of the light-coupling portion 52 in the light forming the spot SP. Note that a curvature radius R1 of 0 in the graph illustrated in FIG. 2B corresponds to a case where the connecting portion between the light-coupling portion 52 and the light-amplifying portion 50 has corners at right angles at the outline of the mesa post 12, that is, the case where the outline of the mesa post 12 changes stepwise from the light-coupling portion 52 to the light-amplifying portion 50.

Modification of First Exemplary Embodiment

Figure 3:
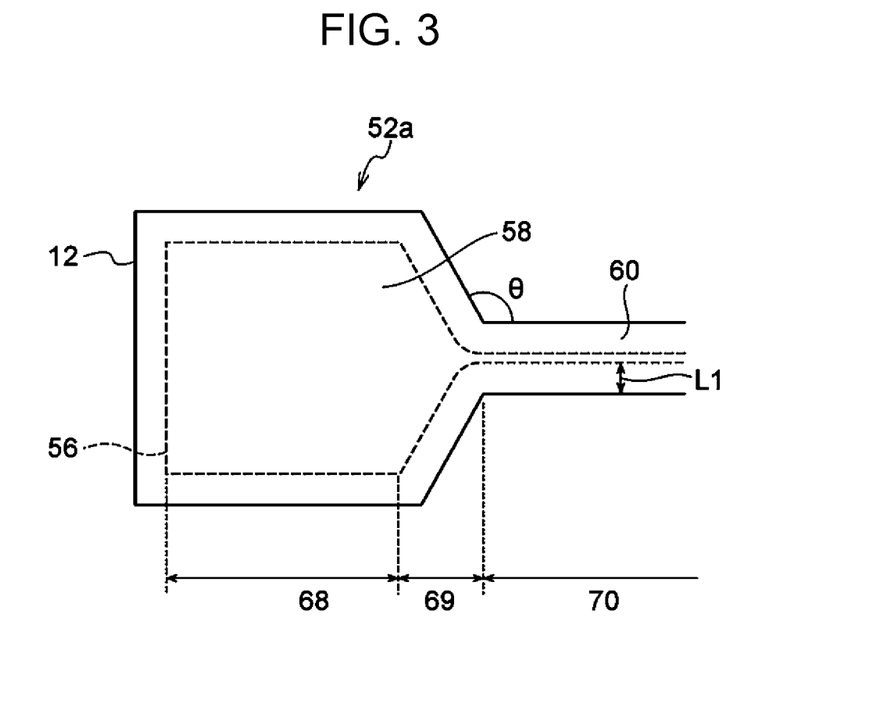
FIG. 3 is a plan view illustrating a modified configuration of the light-coupling portion included in the semiconductor optical amplifier according to the first exemplary embodiment.

Referring to FIG. 3, a semiconductor optical amplifier according to a modification of the first exemplary embodiment will now be described. The present modification is obtained by replacing the light-coupling portion 52 of the semiconductor optical amplifier 10 according to the first exemplary embodiment with a light-coupling portion 52a. Hence, the configuration of the semiconductor optical amplifier itself is basically the same as the configuration illustrated in FIGS. 1A and 1B, which are to be referred to, if necessary. Irrelevant elements are not illustrated in FIG. 3.

As illustrated in FIG. 3, the light-coupling portion 52a includes a conductive region 58 that is tapered in the connecting region 69, with linear outline segments and arc-shaped outline segments (curved outline segments). In the light-coupling portion 52a, the outline of the mesa post 12 at the connecting portion between the light-coupling portion 52 and the light-amplifying portion 50 is defined by a combination of straight lines (an angle θ formed in the connecting region 69 where the outline of the mesa post 12 changes is an obtuse angle). On the other hand, the conductive region 58 in the light-coupling portion 52a includes a portion whose width is gradually reduced, as with the first exemplary embodiment. Therefore, the light-coupling portion 52a yields an improved optical coupling efficiency.

Second Exemplary Embodiment

Figure 4:
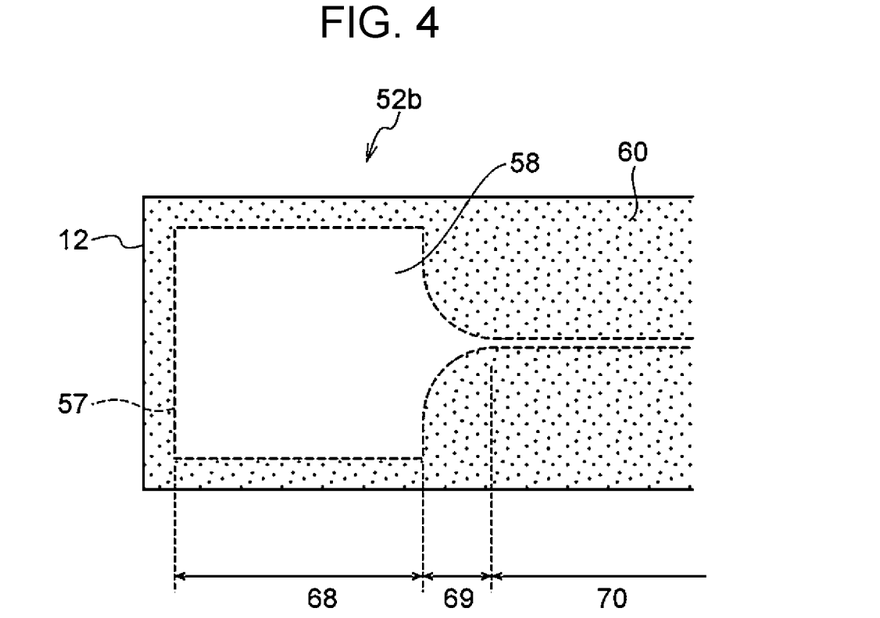
FIG. 4 is a plan view illustrating an exemplary configuration of a light-coupling portion included in a semiconductor optical amplifier according to a second exemplary embodiment.

Referring to FIG. 4, a semiconductor optical amplifier according to a second exemplary embodiment will now be described. In the first exemplary embodiment and the modification thereof, the conductive region 58 is formed by oxidizing the mesa post 12 from the outer side thereof. The semiconductor optical amplifier according to the second exemplary embodiment includes a conductive region formed by ion implantation. The configuration of the semiconductor optical amplifier itself is basically the same as the configuration illustrated in FIGS. 1A and 1B, which are to be referred to, if necessary. Irrelevant elements are not illustrated in FIG. 4.

FIG. 4 illustrates a light-coupling portion 52b according to the second exemplary embodiment. As with the light-coupling portions (52 and 52a) according to the first exemplary embodiment and the modification thereof, the light-coupling portion 52b illustrated in FIG. 4 includes the first region 68, the connecting region 69, and the second region 70. However, the mesa post 12 in the light-coupling portion 52b is different from the mesa post 12 according to the first exemplary embodiment in having a constant width from the light-coupling portion 52b to the light-amplifying portion 50. The light-coupling portion 52b includes a conductive region 58 continuously extending into the light-amplifying portion 50. The width of the conductive region 58 is widened in the light-coupling portion 52b. A region between the outline of the mesa post 12 and the conductive region 58 forms an implanted region in which impurities are implanted. That is, the implanted region corresponds to the nonconductive region 60, and the boundary between the conductive region 58 and the nonconductive region 60 corresponds to an implantation front 57. The implanted region is formed by using a mask in the manufacturing process.

The light-coupling portion 52b also includes a portion where the width of the conductive region 58 is continuously reduced (arc-shaped outline segments) in the connecting region 69. With the arc-shaped outline segments, the optical coupling efficiency between the external light source and the light-coupling portion 52b is improved. In the second exemplary embodiment, the conductive region 58 is formed by using a mask. Therefore, the shape of the conductive region 58 in the connecting region 69 is determined independently of the shape of the mesa post 12. The second exemplary embodiment has been described by taking the semiconductor optical amplifier including the mesa post 12 as an example. Alternatively, the second exemplary embodiment may be applied to, for example, a planar semiconductor optical amplifier that includes no mesa post, because the semiconductor optical amplifier according to the second exemplary embodiment is not subjected to oxidization.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A semiconductor optical amplifier comprising:
a conductive region that is provided on a substrate and allows light transmission; and
a nonconductive region that is provided around the conductive region and prohibits light transmission,
wherein the conductive region includes
a first region including a light-coupling portion to which light from an external light-source unit is coupled; and
a second region having a narrower width than the first region and connected to the first region through a connecting portion, the second region including a light-amplifying portion amplifying the light from the light-coupling portion by propagating the light in a predetermined propagating direction along a surface of the substrate, the light-amplifying portion outputting the amplified light in a direction intersecting the surface of the substrate,
wherein, seen in a direction perpendicular to the surface of the substrate, the semiconductor optical amplifier includes a portion where a width of the conductive region is continuously reduced from the first region to the second region,
wherein the conductive region has a curved outline segment in the connecting portion, and the curved outline segment has a curvature radius of 20 µm or greater and 55 µm or smaller.

2. The semiconductor optical amplifier according to claim 1, further comprising:
a mesa structure having an outline conforming to an outline of the nonconductive region,
wherein, in the connecting portion, the conductive region has a shape conforming to the outline of the mesa structure.

3. The semiconductor optical amplifier according to claim 2,
wherein a curvature radius of the conductive region in the connecting portion is greater than a curvature radius of the outline of the mesa structure in the connecting portion.

4. The semiconductor optical amplifier according to claim 1,
wherein an outline of a mesa structure changes stepwise in the connecting portion.

5. The semiconductor optical amplifier according to claim 4,
wherein the nonconductive region is obtained by oxidizing the mesa structure by a predetermined length of oxidation, and
wherein a curvature radius of the conductive region in the connecting portion is the length of oxidation.

6. The semiconductor optical amplifier according to claim 1,
wherein the nonconductive region is obtained by implantation of an impurity.

7. The semiconductor optical amplifier according to claim 6, further comprising:
a mesa structure including the nonconductive region,
wherein an outline of the mesa structure has a constant width from the first region to the second region.

8. The semiconductor optical amplifier according to claim 1,
wherein the light from the light-source unit forms a spot at a position on a center axis of the second region that extends in the propagating direction and near the portion where the width of the conductive region is continuously reduced.

9. A semiconductor optical amplifier comprising:
a conductive region that is provided on a substrate and allows light transmission; and
a nonconductive region that is provided around the conductive region and prohibits light transmission,
wherein the conductive region includes
a first region including a light-coupling portion to which light from an external light-source unit is coupled; and
a second region having a narrower width than the first region and connected to the first region through a connecting portion, the second region including a light-amplifying portion amplifying the light from the light-coupling portion by propagating the light in a predetermined propagating direction along a surface of the substrate, the light-amplifying portion outputting the amplified light in a direction intersecting the surface of the substrate,
wherein, seen in a direction perpendicular to the surface of the substrate, the semiconductor optical amplifier includes a portion where a width of the conductive region is continuously reduced from the first region to the second region,
a mesa structure having an outline conforming to an outline of the nonconductive region,
wherein, in the connecting portion, the conductive region has a shape conforming to the outline of the mesa structure,
wherein a curvature radius of the conductive region in the connecting portion is greater than a curvature radius of the outline of the mesa structure in the connecting portion.

10. The semiconductor optical amplifier according to claim 9,
wherein the nonconductive region is obtained by oxidizing the mesa structure by a predetermined length of oxidation, and
wherein the curvature radius of the conductive region in the connecting portion is a sum of a curvature radius of the outline of the mesa structure in the connecting portion and the length of oxidation.

11. The semiconductor optical amplifier according to claim 9,
wherein the conductive region includes a tapered portion in the connecting portion, the tapered portion being defined by a linear outline segment and a curved outline segment.

12. The semiconductor optical amplifier according to claim 11,
wherein the outline of the mesa structure forms an obtuse angle in the connecting portion.

13. A semiconductor optical amplifier comprising:
a conductive region that is provided on a substrate and allows light transmission; and
a nonconductive region that is provided around the conductive region and prohibits light transmission,
wherein the conductive region includes
- a first region including a light-coupling portion to which light from an external light-source unit is coupled; and
- a second region having a narrower width than the first region and connected to the first region through a connecting portion, the second region including a light-amplifying portion amplifying the light from the light-coupling portion by propagating the light in a predetermined propagating direction along a surface of the substrate, the light-amplifying portion outputting the amplified light in a direction intersecting the surface of the substrate, wherein, seen in a direction perpendicular to the surface of the substrate, the semiconductor optical amplifier includes a portion where a width of the conductive region is continuously reduced from the first region to the second region,
wherein the light from the light-source unit forms a spot at a position on a center axis of the second region that extends in the propagating direction and near the portion where the width of the conductive region is continuously reduced.

14. The semiconductor optical amplifier according to claim 13,
wherein at least part of the spot is positioned in the portion where the width of the conductive region is continuously reduced.

15. The semiconductor optical amplifier according to claim 13,
wherein the second region serves as a single-mode optical waveguide,
wherein the light from the light-source unit is single-mode light, and
wherein the second region has a width smaller than a diameter of the spot.

16. The semiconductor optical amplifier according to claim 14,
wherein the second region serves as a single-mode optical waveguide,
wherein the light from the light-source unit is single-mode light, and
wherein the second region has a width smaller than a diameter of the spot.

* * * * *